United States Patent
Chakrapani et al.

(10) Patent No.: US 8,018,073 B2
(45) Date of Patent: Sep. 13, 2011

(54) ELECTRONIC PACKAGES WITH FINE PARTICLE WETTING AND NON-WETTING ZONES

(75) Inventors: Nirupama Chakrapani, Chandler, AZ (US); Vijay S. Wakharkar, Paradise Valley, AZ (US); Chris Matayabas, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/050,034

(22) Filed: Mar. 17, 2011

(65) Prior Publication Data

US 2011/0163445 A1    Jul. 7, 2011

Related U.S. Application Data

(62) Division of application No. 12/756,380, filed on Apr. 8, 2010, now Pat. No. 7,927,925, which is a division of application No. 11/521,147, filed on Sep. 14, 2006, now abandoned.

(51) Int. Cl.
*H01L 23/48* (2006.01)

(52) U.S. Cl. ............ 257/778; 438/118; 257/E21.503; 257/783; 257/777

(58) Field of Classification Search ........... 257/777, 257/778, E21.503; 438/118, 127
See application file for complete search history.

(56) References Cited

U.S. PATENT DOCUMENTS

| | | | |
|---|---|---|---|
| 6,794,225 B2 * | 9/2004 | Manepalli et al. | 438/127 |
| 7,112,617 B2 * | 9/2006 | Kim et al. | 522/83 |
| 2002/0060368 A1 * | 5/2002 | Jiang | 257/778 |
| 2005/0121310 A1 * | 6/2005 | Yamada et al. | 204/192.12 |
| 2005/0167647 A1 * | 8/2005 | Huang et al. | 257/14 |
| 2007/0134937 A1 * | 6/2007 | See et al. | 438/775 |

OTHER PUBLICATIONS

D. Qin, Y. Xia, B. Xu, H. Yang, C. Zhu, G. M. Whitesides, Fabrication of Ordered Two-Dimensional Arrays of Micro- and Nanoparticles Using Patterned Self-Assembled Monolayers as Templates, Advanced Materials, vol. 11, Issue 17, pp. 1433-1437, Dec. 1999.*
Srinivasan, U.; Liepmann, D.; Howe, R.T.; Microstructure to substrate self-assembly using capillary forces, Microelectromechanical Systems, Journal of , vol. 10, No. 1, pp. 17-24, Mar. 2001.*
Xiaorong Xiong; Hanein, Y.; Jiandong Fang; Yanbing Wang; Weihua Wang; Schwartz, D.T.; Bohringer, K.F.; Controlled multibatch self-assembly of microdevices, Microelectromechanical Systems, Journal of , vol. 12, No. 2, pp. 117-127, Apr. 2003.*

* cited by examiner

*Primary Examiner* — Kiesha Bryant
*Assistant Examiner* — Mark Tornow
(74) *Attorney, Agent, or Firm* — Trop, Pruner & Hu, P.C.

(57) ABSTRACT

Spreading or keep out zones may be formed in integrated circuit packages by altering the roughness of package surfaces. The surface roughness can be altered by applying or growing particles having a dimension less than 500 nanometers. Hydrophilic surfaces may be made hemi-wicking and hydrophobic surfaces may be made hemi-wicking by particles of the same general characteristics.

5 Claims, 1 Drawing Sheet

ELECTRONIC PACKAGES WITH FINE PARTICLE WETTING AND NON-WETTING ZONES

CROSS-REFERENCE TO RELATED APPLICATIONS

This application is a divisional of U.S. patent application Ser. No. 12/756,380, filed on Apr. 8, 2010, now U.S. Pat. No. 7,927,925 which is a divisional of U.S. patent application Ser. No. 11/521,147, filed on Sep. 14, 2006, now abandoned.

BACKGROUND

This relates to the fabrication of integrated circuit packages for holding integrated circuit chips.

In some integrated circuit packages, a substrate may mount one or more integrated circuit chips. Between the chip and the substrate may be an underfill material. Advantageously, this material fills up the region between the chip and the substrate, but does not extend outwardly by an excessive amount therefrom. Doing so may adversely affect the operation of the packaged part. For example, when the underfill material is injected between the integrated circuit and the substrate, it may tend to flow outwardly, creating what is called a tongue of material that extends out from under the integrated circuit die.

Underfilling may be done by capillary flow. In order to achieve high throughput times, the underfill may be made with a very low viscosity and good wettability to the substrate solder resist. Moreover, the underfill may be dispensed at elevated temperatures. The result of all these factors is that a tongue of underfill is left on the underfill dispense side of the package. The tongue effectively increases the footprint of the package.

DETAILED DESCRIPTION

In some applications in semiconductor integrated circuit packaging, it is desirable to have a substrate that has regions which are both wetting and non-wetting. It would be even more desirable that the substrate have regions that are super wettable and super unwettable. In other words, the same substrates may have surface regions that are hemi-wicking and hydrophobic and hemi-wicking and hydrophilic. As a result, underfill and other fluxes may be closely controlled to spread out in limited regions on the substrate.

In some embodiments of the present invention, fine particle coatings may be applied across a substrate surface. The coatings may, for example, be silicon nanorods which are grown on the substrate and extend to a height of up to 500 nanometers. If the substrate upper surface is relatively hydrophilic, then the presence of the surface roughening nanoparticles serves to greatly increase the hydrophilic nature of the surface in what may be called hemi-wicking. Conversely, if the same surface is hydrophobic, hemi-wicking occurs, nonetheless, making the surface extremely hydrophobic.

Generally, a hydrophilic surface has a surface energy greater than or equal to 70 mN/m. A hydrophobic surface has a surface energy less than or equal to 20 mN/m.

Figure 1:
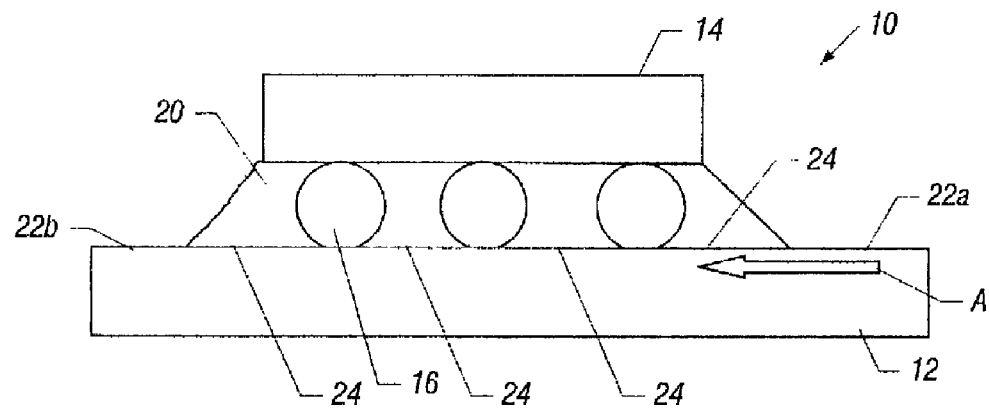
FIG. 1 is an enlarged, cross-sectional view of a package in accordance with one embodiment of the present invention.

Referring to FIG. 1, a substrate 12 has an integrated circuit die 14 mounted thereon in a flip chip arrangement using solder balls 16 to electrically and mechanically connect the die 14 to the substrate 12. The substrate 12 may have interconnections which provide signals to the die 14 and transfer signals from the die 14 to external devices.

The upper surface of the substrate 12 may have peripheral regions 22 (e.g. 22a and 22b) which may be highly hydrophobic or hemi-wicking. Conversely, the regions 24 underneath the die and to a slight degree up from under the die may be very hydrophilic and hemi-wicking. Thus, the underfill material 20 once injected in the direction A, for example, using capillary forces, moves away from the hydrophobic surfaces 22a and 22b and spreads on the hydrophilic surfaces 24. Because the surfaces 22 and 24 are hemi-wicking, the normal wetting and non-wetting effects are enhanced. As a result, the tendency of the underfill 20 to form a tongue by extending outwardly in a direction opposite to the arrow A is reduced. This may achieve a smaller package footprint, in some cases, since substrate surface is not consumed by an underfill tongue.

Figure 3:
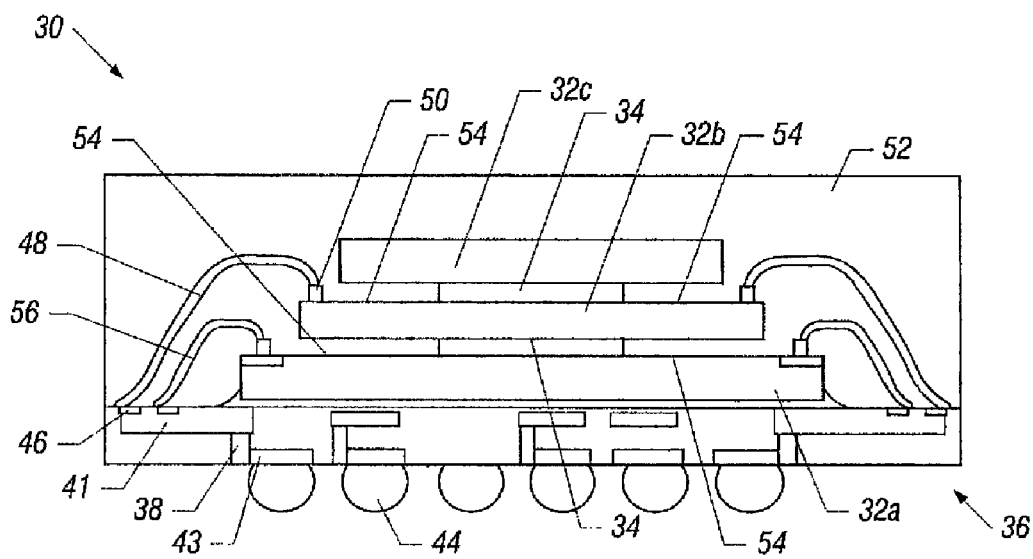
FIG. 3 is an enlarged, cross-sectional view of another embodiment.

As still another example, the package 30 may include a substrate 36 which includes interconnects 44, such as solder balls, as shown in FIG. 3. Electrical vertical vias 38 may be found within the substrate 36 which connect to horizontal metallizations 41 to distribute signals between the external world coupled by the interconnects 44 and the integrated circuit dice 32a, 32b, and 32c within the package 30. An encapsulant 52 may encapsulate the dice 32a, 32b, and 32c.

The die 32a may be coupled by a wire bond 56 to a pad 46 on the substrate 36. The pad 46 may be coupled by the horizontal metallization 41 to the vertical via 38 and, ultimately, down to a pad 43 that is coupled to an interconnect 44. In this way, communications may be had between external components and the die 32a. Likewise, the wire bond 48 may connect to the die 32b via contact 50. Connections to the die 32c may be provided in a variety of different ways. The die 32c may be coupled to the die 32b by a die attach adhesive layer 34. Likewise, the die 32b may be coupled by a die attach adhesive layer 34 to the die 32a. However, other techniques for securing the dice together may also be utilized.

In this case, it may be desirable to prevent the adhesive used for the die attach 34 from bleeding out. If the die attach bleeds out, it may foul the regions intended for wire bond contacts. Thus, the surfaces 54 may be treated to be highly hydrophobic and hemi-wicking. These surfaces may be provided on both the die 32b upper surface and the die 32c upper surface.

Figure 2:
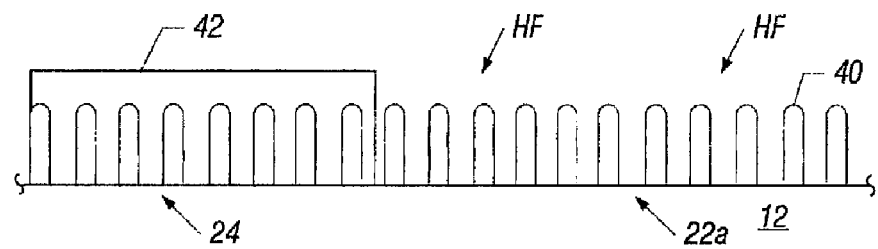
FIG. 2 is a greatly enlarged, cross-sectional view of a portion of the upper surface of the package substrate shown in FIG. 1.

Referring back to FIG. 2, in some embodiments of the present invention, the fine particles 40 may be grown on the substrate 12. The particles 40 may, for example, be nanorods, spherical particles, or tetrapods, etc. However, other components and shapes may be utilized. They may be made of materials including, but not limited to, silica, alumina, zirconia, silicon, or carbon, etc. Generally, it is desirable that these particles 40 have a height above the surface of the substrate 12 of from 5 to 500 nanometers. This is effective to enhance the hydrophobic or hydrophilic nature of the resulting surface.

When it is desired to form both hydrophilic and hydrophobic structures on the same surface, the same fine elements may be formed. That is, particles 40 of comparable composition and size may be formed across the surfaces that are supposed to be ultimately hemi-wicking and hydrophobic or hemi-wicking and hydrophilic. Then, the surfaces that are to be hydrophobic may be exposed to a hydrofluoric acid treatment. The surfaces that will remain hydrophilic may be masked with a suitable, removable mask 42.

Other hydrophobic treatments may also be used. For example, fluorinated silanes are hydrophobic. They can easily be functionalized to surfaces via alcohol groups or with plasma treatment prior to functionalization. For example, a constituent $R_3$—Si—OH, together with HO-substrate solder resist yields $R_3$—Si—O-substrate solder resist. The constituent R may be, but need not be limited to, an alkane, vinyl, or fluorine. Alternatively, different treatments may be used to create a hydrophilic surface. For example, amine terminated silanes are hydrophilic. In addition, alkane silanes are hydrophobic. Moreover, long chain alkanes self-assemble into monolayers, rendering very high density silanes on the surface. Such monolayers may be deposited by a solvent route or by vapor deposition. In addition, hydroxyl groups on a solder resist surface can link silanols with appropriate moieties to render them non-wetting to underfills. Specific regions of a surface may be patterned with a silane treatment to obtain regions that are non-wetting to underfill.

In some embodiments of the present invention, the structure may be dipped to apply the hydrofluoric acid. The hydrofluoric acid may be 48 to 51 percent and the exposure may be for one minute in some embodiments of the present invention.

The growth of the particles 40 in the form of nanorods may be done using glancing angle deposition techniques. Glancing angle deposition involves physical vapor deposition on a substrate that is rotated in two different directions. A glancing angle is formed between the input vapor source and the surface on which the nanorods are intended to be grown. In some cases, the angle may be from 70 to 90 degrees. A deposition rate of 0.2 $nMs^{-1}$ and a rotation speed of 0.05 $revs^{-1}$ may be used. An electron beam evaporator with a quartz crystal thickness monitor may be used to detect the film thickness.

Thus, surfaces can be selectively made highly hydrophilic or highly hydrophobic. Hydrophobic regions may be effective keep out zones to prevent incursion of fluxes, underfills, or encapsulants, to mention a few examples. Conversely, the spreading of underfills and molding compounds through narrow channels over ever-shrinking packages may be improved by creating a hemi-wicking surface.

Nanoparticles generally have at least one of their dimensions less than 100 nanometers. However, as used herein, a fine particle is a particle with a size up to 500 nanometers. Suitable shapes include, but are not limited, spheres, tetrapods, rods, tubes, and platelets, to mention a few examples. Suitable materials include, but are not limited to, silica, alumina, titania, zirconia, and carbon.

Instead of growing the particles, deposited particles may be utilized. In one embodiment, particles, such as microspheres, of at least two different sizes are mixed and then deposited. The particles may be secured by an adhesive coating, but other techniques may be used as well.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit package comprising:
   a package surface;
   hydrophobic particles and hydrophilic particles, each having a dimension less than 500 nanometers, formed on said package surface;
   a liquid applied over said hydrophilic particles; and
   a die positioned over said liquid,
   wherein said hydrophobic particles are formed on said package surface around said liquid.

2. The package of claim 1 wherein said liquid is underfill.

3. The package of claim 1 wherein said liquid is die attach.

4. The package of claim 1 wherein said surface is a die surface.

5. The package of claim 1 wherein said surface is a package substrate surface.

* * * * *